United States Patent [19]

Strickland

[11] 4,390,845
[45] Jun. 28, 1983

[54] GATED QUADRATURE DETECTOR BIASED TO SWITCH ON SINUSOIDAL ZERO CROSSINGS

[75] Inventor: Lawrence P. Strickland, Tamarac, Fla.

[73] Assignee: Motorola, Inc., Schaumburg, Ill.

[21] Appl. No.: 213,762

[22] Filed: Dec. 5, 1980

[51] Int. Cl.³ .......................... H03D 3/22; H03K 9/06
[52] U.S. Cl. .................................... 329/103; 329/137; 329/145; 455/214; 328/166
[58] Field of Search ............... 329/103, 110, 131, 134, 329/137, 140, 145; 307/556, 252 UA, 354; 328/166; 455/210, 214, 304, 308, 337

[56] References Cited

U.S. PATENT DOCUMENTS

| | | | |
|---|---|---|---|
| 2,965,848 | 12/1960 | Van Overbeek | 329/134 X |
| 3,119,064 | 1/1964 | Hillis . | |
| 3,373,366 | 3/1968 | Schulz | 455/210 X |
| 3,500,217 | 3/1970 | Allen . | |
| 3,508,161 | 4/1970 | Bingham | 328/166 |
| 3,548,326 | 7/1967 | Bilotti . | |
| 3,798,557 | 3/1974 | Scott et al. . | |
| 3,999,138 | 12/1976 | Peil et al. . | |

OTHER PUBLICATIONS

Adler, "FM Detector Tube With Instantaneous Limiting and Single-Circuit Discriminator", Radio News—Engineering Dept., Jun. 1948, pp. 17-18.

Primary Examiner—Siegfried H. Grimm
Assistant Examiner—Edward P. Westin
Attorney, Agent, or Firm—John H. Moore; James W. Gillman; Edward M. Roney

[57] ABSTRACT

A quadrature detector includes a driving circuit for applying a frequency modulated square-wave to one input of a gating circuit and to the input of a phase-shift network whose output is connected directly to the other input of the gating circuit. A tracking DC bias voltage is introduced at the input of the gating circuit which is coupled to the output of the phase-shift network, and the level of this DC voltage is selected so that the gating circuit switches on the zero-crossings of the sinusoid outputted by the phase-shift network. This scheme eliminates the need for a limiter used in conventional quadrature detectors that operate from low-voltage power supplies such as a one volt battery.

3 Claims, 3 Drawing Figures

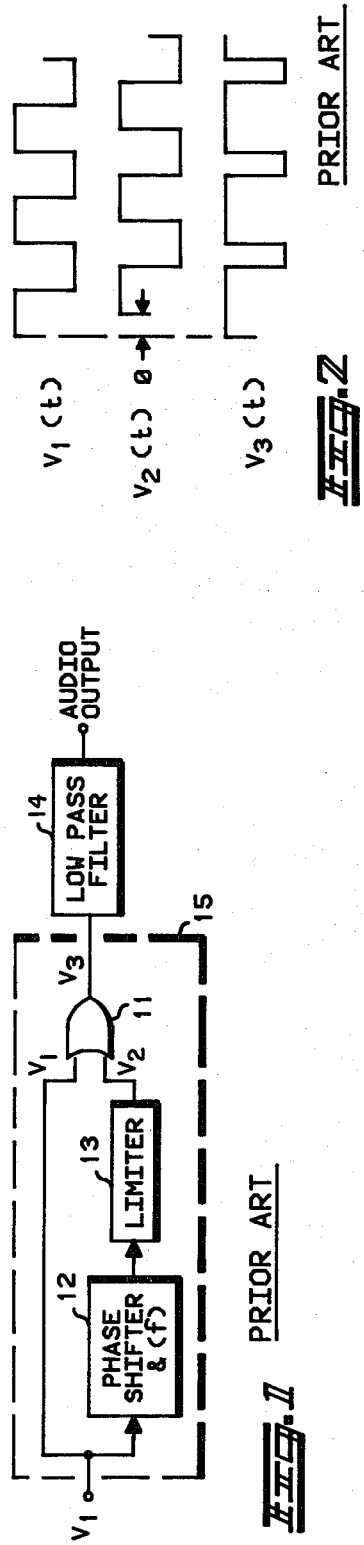
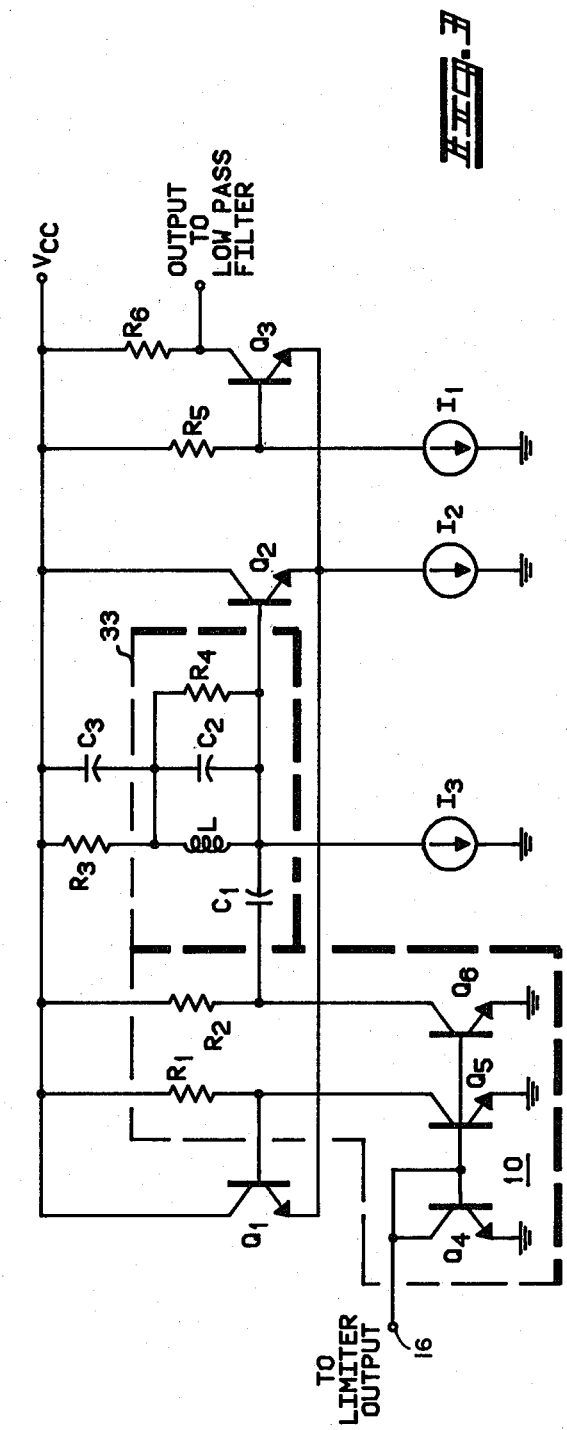

GATED QUADRATURE DETECTOR BIASED TO SWITCH ON SINUSOIDAL ZERO CROSSINGS

BACKGROUND OF THE INVENTION

1. Field of the Invention

This invention relates to a quadrature detector used in FM demodulation and, more particularly, a quadrature detector of a simpler structure which also requires a very low power supply voltage.

2. Description of the Prior Art

In the past, double-balanced mixers with frequency dependent phase-shift networks have been used extensively in implementing quadrature demodulation of FM signals. A conventional, active, double-balanced mixer, such as the one illustrated on pages 103–106 of *Analog Integrated Circuits*, by J. A. Connelly, published by John Wiley and Sons, requires a power supply voltage in the range of two volts or higher. In order to implement quadrature demodulation with a lower power supply voltage of about one volt, a quadrature detector of the type illustrated in FIG. 1 has been proposed. FIG. 2 depicts various waveforms which illustrate the operation of the detector shown in FIG. 1. As shown in FIGS. 1 and 2, the signal from the FM receiver's limiter (not shown), $V_1$, is applied to one input of a gating circuit 11; another input, namely $V_2$, which is a phase-shifted by a certain amount, $\emptyset$, and limited version of $V_1$, is obtained by processing $V_1$ through a phase shifter 12 and a limiter 13, is applied to the other input of the gating circuit; the amount of phase-shift is a function of the frequency of $V_1$. The output of the gating circuit, $V_3$, is a pulse-train whose duty-cycle varies with the frequency of $V_1$. This pulse-train is then integrated with a low-pass filter (LPF) 14 in order to obtain the original modulating signal.

Note that the prior art demodulator 15 shown in FIG. 1 requires limiter 13 between the phase-shift network output and the gating circuit input. This is because the output of the phase-shift network is sinusoidal and the additional limiter is used to mark or sharpen the zero-crossings of the sinusoid so that the gating circuit switches at the proper time intervals.

SUMMARY OF THE INVENTION

It is an object of the present invention to simplify the prior art quadrature detector which requires a limiter interposed between the phase-shift network output and one of the gating circuit inputs.

According to the present invention, the necessity of a limiter is circumvented in the following manner. An active current sink, resistor, and capacitor are coupled to the phase-shift network in such a manner as to provide a DC bias voltage at one of the inputs to the gating circuit upon which the sinusoidal output waveform from the phase-shift network is superimposed. This DC bias voltage is selected so that the gating circuit switches on the zero-crossings of the sinusoid when the input frequency changes, giving the same results as if the sinusoid were processed through a limiter.

Since the active current sink and resistor track inversely over variations in the IC manufacturing process, the DC bias voltage remains essentially constant from lot to lot. Also, since the regulated power supply voltage can be made to track changes in the base-emitter voltage drops over temperature, the DC bias voltage produced by the said network will track the changes in base-emitter voltage drops when connected to such a regulated supply.

The present inventive quadrature detector will be more clearly understood from the detailed description of an illustrative embodiment with reference to the accompanying drawings.

BRIEF DESCRIPTION OF THE DRAWINGS

FIG. 1 shows a functional block diagram of a prior art quadrature detector.

FIG. 2 shows pertinent wave forms associated with detector shown in FIG. 1.

FIG. 3 shows a schematic drawing illustrating a quadrature detector according to the present invention.

DETAILED DESCRIPTION OF THE PREFERRED EMBODIMENT

Referring to the accompanying schematic diagram of FIG. 3, there is shown a quadrature detector that embodies the present invention. As illustrated, the quadrature detector includes a gating circuit, such as an emitter coupled OR gate comprised of transistors $Q_1$, $Q_2$, and $Q_3$ operatively connected in a conventional manner. The base electrodes of transistors $Q_1$ and $Q_2$ are the inputs to the gate, and the collector electrode of $Q_3$ is the output, which is typically connected to a low-pass filter (LPF).

The output transistor, $Q_3$, is connected to the biasing resistors $R_5$ and $R_6$ and to an active DC current sink, $I_1$, in a conventional manner. Inputs to the gating circuit are applied thereto by a conventional driving circuit comprised of transistors $Q_4$, $Q_5$, and $Q_6$ connected as illustrated. The diode, formed by shorting the base and collector electrodes of transistor $Q_4$, is switched on and off by a square-wave signal applied to terminal 16. The transistors $Q_5$ and $Q_6$ are arranged to be in a current mirror circuit form to turn on and off to supply two inputs across resistors $R_1$ and $R_2$ to the two transistors $Q_1$ and $Q_2$ in response to the input train. This square-wave signal may be obtained from the limiter of an FM radio receiver.

The quadrature detector includes a conventional phase-shift network, 33, comprised of capacitor, $C_1$, an inductor, L, another capacitor, $C_2$, and a resistor, $R_4$, connected in a well-known manner as illustrated. $C_1$, L, $C_2$, and $R_4$ are interposed between the base electrode of $Q_2$ and the collector electrode of $Q_6$. The phase-shift network, 33, shifts the phase of the square-waves applied thereto from the collector electrode of $Q_6$ and applies this phase-shifted output to the base electrode of $Q_2$. The phase-shifted output is sinusoidal due to the operative property of the phase-shift network.

The phase-shift is relative to the square-wave signal applied to the base electrode of transistor, $Q_1$, from the collector electrode $Q_5$. The transistor $Q_3$ is off when the transistor $Q_1$ or the transistor $Q_2$ is turned on. As a result, the output of the transistor $Q_3$ is a pulse-train whose duty cycle is a function of the frequency of the input signal applied to terminal 28. One can then apply this output to a low-pass filter to integrate the pulse-train, and thereby recover the original modulating signal.

According to the present invention, there is further provided a biasing network comprised of a resistor, $R_3$, a capacitor, $C_3$, which is connected in parallel with $R_3$, and an active DC current sink circuit, $I_3$, coupled to the base electrode of $Q_2$, as illustrated. $R_3$ and $C_3$ are connected to the DC power supply, $V_{cc}$, as is the rest of the detector circuit, as illustrated.

The emitter electrodes of $Q_1$, $Q_2$, and $Q_3$ are connected to an active DC current sink, $I_2$, in a conventional manner. For a conventional active DC current sink circuit, one may refer to *Basic Integrated Circuit Engineering*, by Douglas J. Hamilton and William G. Howard, published by McGraw-Hill Book Company, 1976, pages 312 and 313.

The bias voltage produced by $R_3$, $C_3$, and $I_3$ is selected so that, when the input frequency changes, the zero-crossings of the sinusoid from the phase-shift network output are at the switching threshold level of $Q_2$. This forces $Q_2$ to switch on the zero-crossings of the sinusoid instead of some other level, which would cause timing errors in the switching of $Q_2$. Thus, the components $R_3$, $C_3$, and $I_3$, connected as illustrated, eliminate the need for a limiter between the phase-shift network output and the base of $Q_2$.

Furthermore, because $R_3$ and $I_3$ track inversely over variations in the IC manufacturing process, for example, when $R_3$ is 20% low, $I_3$ is 20% high, the DC bias voltage produced by them will remain constant from lot to lot.

An additional feature is provided by operating this detector from a regulated power supply whose supply voltage varies with temperature changes in accordance with the temperature-dependent changes in base-emitter voltage drops of the transistors $Q_1$, $Q_2$, and $Q_3$. For example, if the temperature decreases, the base-emitter voltage drop of $Q_2$ increases. If the voltage, $V_{cc}$ is made to increase by a proportionate amount, then the bias voltage produced by $R_3$, $C_3$, and $I_3$ will increase to the proper level in order to compensate for the increase in the base-emitter voltage of $Q_2$. For an example of such a power supply see U.S. Pat. Nos. 3,617,859 and 4,017,788.

Various changes and modifications may be made to the present detector without departing from the spirit and scope thereof.

What is claimed is:

1. A quadrature detector, comprising:
    an input driver including a current mirror circuit receiving an input train of variable frequency waves for developing first and second outputs;
    a phase-shift network receiving the first output of the input driver for developing a phase-shifted output;
    a gating circuit comprising a plurality of transistors forming an OR gate responsive to the phase-shifted output of the phase-shift network and the second output of the input driver; and
    a biasing circuit, including a resistor coupled between a voltage source and the phase-shift network and an active current sink coupled to the phase-shift network, for applying a DC bias to the output of the phase-shift network and to the gating circuit so that the gating circuit switches on those zero crossings of the output of the phase-shift network which are induced by frequency changes associated with the input train of waves.

2. The detector according to claim 1, wherein said resistor and said active current sink track inversely over the variations of characteristics from lot to lot introduced during its manufacturing process.

3. The detector according to claim 2, wherein said voltage source comprises a regulated power supply whose output voltage varies with temperature changes in accordance with the temperature dependent changes in the base-to-emitter voltage drops of the transistors.

* * * * *